(12) United States Patent
Yokota et al.

(10) Patent No.: US 7,710,130 B2
(45) Date of Patent: May 4, 2010

(54) VOLUME RESISTIVITY MEASUREMENT APPARATUS FOR DIELECTRIC LAYER OF ELECTROSTATIC CHUCK AND MEASUREMENT METHOD USING THE APPARATUS

(75) Inventors: Minoru Yokota, Okazaki (JP); Kazuhiro Nobori, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 309 days.

(21) Appl. No.: 11/954,386

(22) Filed: Dec. 12, 2007

(65) Prior Publication Data
US 2008/0143353 A1 Jun. 19, 2008

(30) Foreign Application Priority Data
Dec. 15, 2006 (JP) .............................. 2006-338469

(51) Int. Cl.
*G01R 27/02* (2006.01)
(52) U.S. Cl. ...................... 324/715; 324/719
(58) Field of Classification Search ................. 324/713, 324/715, 719
See application file for complete search history.

(56) References Cited

U.S. PATENT DOCUMENTS 4,446,424 A * 5/1984 Chatanier et al. ........... 324/713
5,093,626 A * 3/1992 Baer et al. .................. 324/671

FOREIGN PATENT DOCUMENTS

JP 11-223646 A1 8/1999
JP 2000-088900 A1 3/2000

* cited by examiner

*Primary Examiner*—Vincent Q Nguyen
(74) *Attorney, Agent, or Firm*—Burr & Brown

(57) ABSTRACT

A pair of conductive rubber electrodes including measurement surfaces opposite to a surface of a dielectric layer of an electrostatic chuck as an objective of measurement, in which the measurement surfaces are arranged at an interval individually on the same plane, are provided. A direct-current power supply and an ammeter are connected to the pair of conductive rubber electrodes. The conductive rubber electrodes have resistance values equal to each other, and have a shape in which the measurement surfaces have areas equal to each other, in which volume resistivities are $1 \times 10^5$ Ω·cm or less, and hardness is within a range of 60 to 80 Hs in JIS-A hardness. An interval between the conductive rubber electrodes is six times or more a thickness of the dielectric layer of the electrostatic chuck as the objective of the measurement.

3 Claims, 4 Drawing Sheets

VOLUME RESISTIVITY MEASUREMENT APPARATUS FOR DIELECTRIC LAYER OF ELECTROSTATIC CHUCK AND MEASUREMENT METHOD USING THE APPARATUS

CROSS REFERENCE TO RELATED APPLICATIONS

This application is based upon and claims the benefit of priority from Patent Application No. 2006-338469 filed on Dec. 15, 2006, in the Japanese Patent Office, of which contents are incorporated herein by reference.

BACKGROUND OF THE INVENTION

1. Field of the Invention

The present invention relates to a volume resistivity measurement apparatus for a dielectric layer of an electrostatic chuck, and to a method using the apparatus.

2. Description of the Related Art

An electrostatic chuck is used for sucking and holding a semiconductor substrate, for example, in the case of performing a variety of treatments such as deposition and etching for the semiconductor substrate or in the case of carrying the semiconductor substrate among treatment apparatuses in a manufacturing process of a semiconductor device. As such an electrostatic chuck, there is one including a plate-like base made of ceramics, in which one of planes of the base is a holding surface of the semiconductor substrate, and an electrostatic electrode is embedded in the base in the vicinity of the holding surface. When electric power is supplied to the electrostatic electrode from the outside, a region between the electrostatic electrode and the holding surface in the base is polarized to become a dielectric layer. Then, electrostatic force is generated on the holding surface, thus making it possible to suck the semiconductor substrate. In the electrostatic chuck having such a basic principle, main suction force for holding the substrate is broadly divided based on volume resistivity of the dielectric layer. In this connection, there are an electrostatic chuck using Coulomb force as main suction force, and an electrostatic chuck using Johnson-Rahbek force as main suction force.

The volume resistivity of the dielectric layer of the electrostatic chuck is an important factor that affects product characteristics of the electrostatic chuck, and the dielectric layer is required to have predetermined volume resistivity. This volume resistivity of the dielectric layer of the electrostatic chuck is sometimes varied depending on manufacturing conditions thereof in a manufacturing process of the electrostatic chuck. Therefore, it is useful to confirm the volume resistivity of the dielectric layer of the manufactured electrostatic chuck in order also to enhance yield of the product.

Heretofore, as a method of measuring the volume resistivity of the electrostatic chuck having the base made of ceramics, there has been a method conforming to JIS-K6911. Moreover, in the case of carrying out the above-described method conforming to JIS-K6911, thermal sticking sometimes occurs on conductive rubbers coated on surfaces of electrodes, which are in contact with a sample. In order to prevent the thermal sticking, there has been a volume resistivity measurement apparatus in which a current limiting resistor is connected in series to a direct-current power supply (Japanese Patent. Laid-Open Publication No. 2000-88900).

However, these method and apparatus are ones to arrange opposite electrodes so that the opposite electrodes can sandwich such a measurement sample therebetween, and then to measure the volume resistivity between the opposite electrodes. Accordingly, when the measurement sample is the electrostatic chuck, these method and apparatus are ones to entirely measure the volume resistivity of the base of the electrostatic chuck. Therefore, these method and apparatus are not ones to partially measure the volume resistivity of the dielectric layer of the electrostatic chuck.

Therefore, heretofore, in order to measure the volume resistivity of only the dielectric layer of the electrostatic chuck, the following procedures have been taken. First, a hole that reaches the electrostatic electrode embedded in the base is drilled from a surface of the base, which is opposite with the holding surface. Then, a part of the electrostatic electrode is exposed to a bottom surface of the hole, a measurement terminal is electrically connected to the exposed electrostatic electrode, and the electrostatic electrode is utilized as one of measuring electrodes. In addition, the other measuring electrode is provided on a surface of the dielectric layer, that is, on the holding surface of the base in a manner of being opposite to the above-described one measuring electrode. Then, a voltage is applied between these measuring electrodes, and a current value is measured. In such a way, the volume resistivity has been obtained.

In the method as described above, which is of measuring the volume resistivity of the dielectric layer by drilling the hole that reaches the electrostatic electrode embedded in the base from the opposite surface of the base with the holding surface, and by exposing a part of the electrostatic electrode to the bottom surface of the hole, time and labor are required for a drilling process of the hole when the base of the electrostatic chuck is made of ceramics. The measurement of the volume resistivity of the dielectric layer is performed in order to confirm whether or not the electrostatic chucks have the predetermined volume resistivity for each of lots among which the manufacturing conditions sometimes differ. Hence, in the case where the time and the labor are required for the drilling process implemented in order to measure the volume resistivity, when an electrostatic chuck defective in terms of the volume resistivity occurs, it takes time to give feedback to discontinue production of the electrostatic chucks. This may undesirably result in manufacture of a large quantity of defective pieces.

The present invention advantageously solves the above-described problems. It is an object of the present invention to provide a volume resistivity measurement apparatus for a dielectric layer of an electrostatic chuck, which makes it possible to measure the volume resistivity of the dielectric layer of the electrostatic chuck without implementing the drilling process for the electrostatic chuck to be manufactured, thus enabling rapid measurement of the volume resistivity, and to provide a measurement method using the apparatus.

SUMMARY OF THE INVENTION

The volume resistivity measurement apparatus for a dielectric layer of an electrostatic chuck according to the present invention includes: a pair of conductive rubber electrodes including measurement surfaces opposite to a surface of the dielectric layer of the electrostatic chuck as an objective of measurement, in which the measurement surfaces are arranged at an interval individually on a same plane; and a direct-current power supply and an ammeter, which are provided in an electric circuit that connects the pair of conductive rubber electrodes to each other, wherein the respective conductive rubber electrodes have resistance values equal to each other, and have a shape in which the measurement surfaces have areas equal to each other, an interval between the respective conductive rubber electrodes is six times or more a thickness of the dielectric layer of the electrostatic chuck as the objective of the measurement, volume resistivities of the respective conductive rubber electrodes are $1\times10^5$ Ω·cm or less, and hardness of the respective conductive rubber electrodes is within a range of 60 to 80 Hs in JIS-A hardness.

A volume resistivity measurement method for a dielectric layer of an electrostatic chuck according to the present invention includes: using, as a pair of conductive rubber electrodes arranged opposite to a surface of the dielectric layer of the electrostatic chuck as an objective of measurement, electrodes including measurement surfaces opposite to the surface of the dielectric layer of the electrostatic chucks and having resistance values equal to each other and a shape in which the measurement surfaces have areas equal to each other, in which volume resistivities are $1\times10^5$Ω·cm or less, and hardness is within a range of 60 to 80 Hs in JIS-A hardness; arranging the pair of conductive rubber electrodes so as to place the measurement surfaces of the respective conductive rubber electrodes on a same plane and to space the respective conductive rubber electrodes from each other at an interval of six times or more a thickness of the dielectric layer of the electrostatic chuck, and thereafter, bringing the measurement surfaces and the surface of the dielectric layer of the electrostatic chuck into intimate contact with each other; and calculating the volume resistivity of the dielectric layer of the electrostatic chuck by using an average value of current values measured by an ammeter connected to an electric circuit that connects the pair of conductive rubber electrodes to each other, the current values being obtained after alternately applying a positive voltage and a negative voltage from a direct current power supply provided in the electric circuit.

In accordance with the volume resistivity measurement apparatus for a dielectric layer of an electrostatic chuck according to the present invention, it becomes possible to measure the volume resistivity of the dielectric layer without implementing the drilling process for the manufactured electrostatic chuck.

In accordance with the volume resistivity measurement method for a dielectric layer of an electrostatic chuck according to the present invention, it becomes possible to more accurately perform the measurement of the volume resistivity by the above-described volume resistivity measurement apparatus.

BRIEF DESCRIPTION OF THE DRAWINGS

The above and further objects, features and advantages of the invention will be more fully appear in the detailed description of embodiments of the invention, when the same is read in conjunction with the drawings, in which.

DETAILED DESCRIPTION OF THE EMBODIMENTS

A description will be made below of a volume resistivity measurement apparatus for a dielectric layer of an electrostatic chuck according to embodiments of the present invention by using the drawings.

Figure 1:
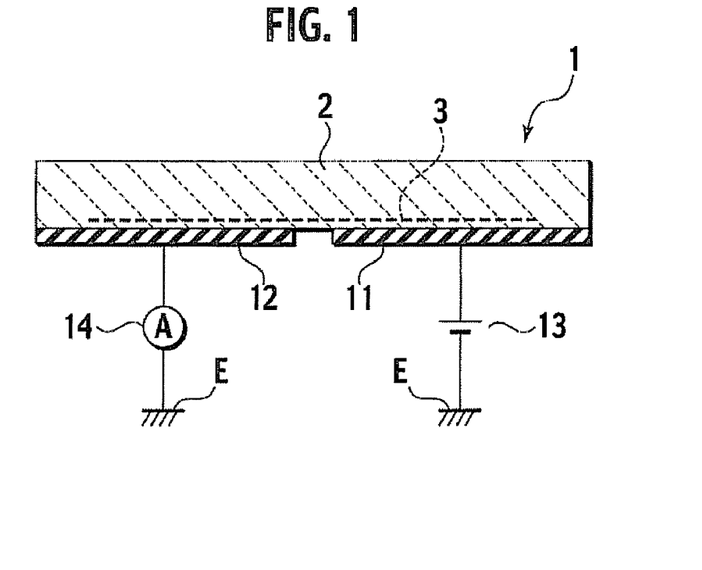
FIG. 1 is a schematic view showing a volume resistivity measurement apparatus for a dielectric layer of an electrostatic chuck according to an embodiment of the present invention.

FIG. 1 is a schematic cross sectional view showing a volume resistivity measurement apparatus for a dielectric layer of an electrostatic chuck according to an embodiment of the present invention. In FIG. 1, an electrostatic chuck 1 as an objective of volume resistivity measurement includes: a plate-like base 2 made of ceramics; and an electrostatic electrode 3 embedded in the vicinity of one surface of the base 2, which is a substrate holding surface. A region between the electrostatic electrode 3 and the substrate holding surface in the base 2 is a region of the dielectric layer.

The volume resistivity measurement apparatus of this embodiment includes a first conductive rubber electrode 11 and a second conductive rubber electrode 12, each of which has a flat plate shape so as to be opposite to the substrate holding surface of the electrostatic chuck 1. Surfaces of the first conductive rubber electrode 11 and the second conductive rubber electrode 12, which are opposite to the substrate holding surface of the electrostatic chuck 1, are measurement surfaces, and are formed to be planar so as to be capable of intimately contacting the substrate holding surface of the electrostatic chuck 1. The first conductive rubber electrode 11 and the second conductive rubber electrode 12 are arranged at a predetermined interval so that the measurement surface of the first conductive rubber electrode 11 and the measurement surface of the second conductive rubber electrode 12 can be located on the same plane.

In this embodiment shown in FIG. 1, a positive electrode side of a direct current power supply 13 is connected to the first conductive rubber electrode 11, and an ammeter 14 is connected to the second conductive rubber electrode 12. A lead wire connected to a negative electrode side of the direct current power supply 13 is grounded, and in addition, a lead wire connected to the ammeter 14 is also grounded. In such a way, an electric circuit is formed, which connects the first conductive rubber electrode 11, the direct-current power supply 13, the ammeter 14 and the second conductive rubber electrode 12 to one another.

In the case of measuring the volume resistivity of the dielectric layer of the electrostatic chuck by using the volume resistivity measurement, apparatus of this embodiment, which includes the first conductive rubber electrode 11, the second conductive rubber electrode 12, the direct current, power supply 13 and the ammeter 14, the first conductive rubber electrode 11 and the second conductive rubber electrode 12 are arranged at the predetermined interval so that the respective measurement surfaces thereof can face upward. Then, the electrostatic chuck 1 is mounted on the first conductive rubber electrode 11 and the second conductive rubber electrode 12 while allowing the substrate mounting surface of the electrostatic chuck 1 to face downward so that the substrate mounting surface of the electrostatic chuck 1 can be opposite to the respective measurement surfaces of the first conductive rubber electrode 11 and the second conductive rubber electrode 12. Note that the first conductive rubber electrode 11 and the second conductive rubber electrode 12 are supported and fixed by an insulator (not shown). In such a way, the respective measurement surfaces of the first conductive rubber electrode 11 and the second conductive rubber electrode 12 and the substrate holding surface of the electrostatic chuck 1 are brought into intimate contact with each other by self weight of the electrostatic chuck 1.

In a state where the respective measurement surfaces of the first conductive rubber electrode 11 and the second conductive rubber electrode 12 and the substrate holding surface of the electrostatic chuck 1 are in intimate contact with each other, when a direct-current voltage is applied to the electric circuit from the direct-current power supply 13, a direct current flows from the first conductive rubber electrode 11 through the dielectric layer of the electrostatic chuck 1 to the electrostatic electrode 3. Then, the direct current flows from the electrostatic electrode 3 through the dielectric layer of the electrostatic chuck 1 to the second conductive rubber electrode 12. Finally, the direct current flows from the second conductive rubber electrode 12 to the ammeter 14. The volume resistivity of the dielectric layer of the electrostatic chuck 1 can be calculated from a predetermined voltage value applied from the direct-current power supply 13 and a current value measured by the ammeter 14 in the electric circuit described above.

In accordance with the volume resistivity measurement apparatus of this embodiment, the volume resistivity of the dielectric layer of the electrostatic chuck 1 can be measured by using a pair of the conductive rubber electrodes brought into intimate contact with the substrate holding surface of the electrostatic chuck 1 as the objective of the measurement. Accordingly, it is not necessary to implement a drilling process for the electrostatic chuck 1 in the case of measuring the volume resistivity. Hence, the volume resistivity can be measured rapidly. Moreover, since the measurement is performed for the electrostatic chuck in a non-destructive manner, highly reliable measurement can be performed.

Figure 2:
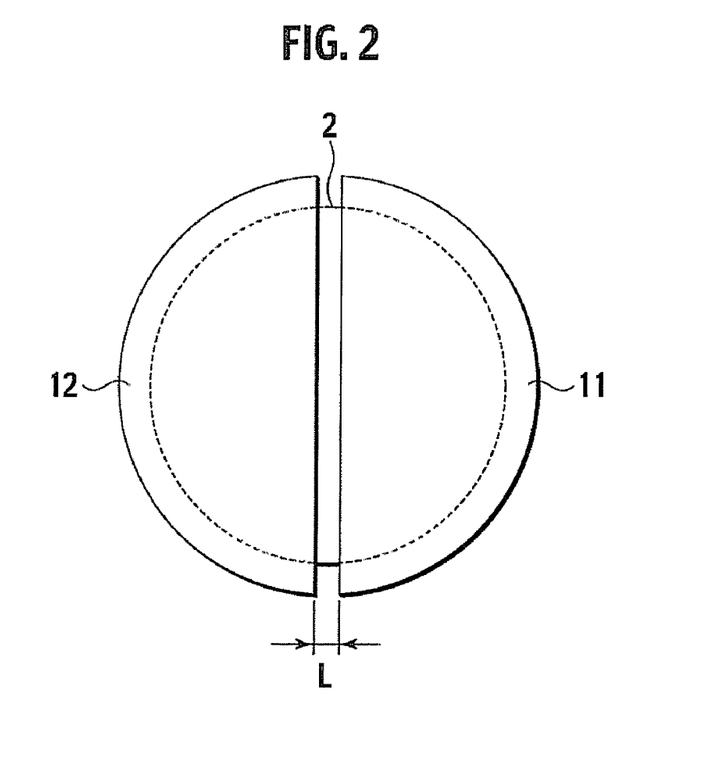
FIG. 2 is a plan view showing an example of conductive rubber electrodes of the volume resistivity measurement apparatus.

A description will be made of an example of the planar shape of the first conductive rubber electrode 11 and the second conductive rubber electrode 12 by using a plan view of FIG. 2. In this embodiment shown in FIG. 2, each of the first conductive rubber electrode 11 and the second conductive rubber electrode 12 has a semicircular or D-shaped planar shape obtained by bisecting a circle by a segment passing through a center thereof, in which a size is sufficient for covering the substrate holding surface of the electrostatic chuck 1. Note that the volume resistivity measurement apparatus of the present invention is not limited to the planar shape of the first conductive rubber electrode 11 and the second conductive rubber electrode 12, which is illustrated in FIG. 2. Any shape may be adopted as long as the measurement surfaces of the first conductive rubber electrode 11 and the second conductive rubber electrode 12 have areas equal to each other, and as long as the first conductive rubber electrode 11 and the second conductive rubber electrode 12 have resistance values equal to each other. When the area of the measurement surface of the first conductive rubber electrode 11 and the area of the measurement surface of the second conductive rubber electrode 12 differ from each other, and the resistance values of both of the first conductive rubber electrode 11 and the second conductive rubber electrode 12 differ from each other, the volume resistivity of the dielectric layer of the electrostatic chuck 1 cannot be measured accurately.

Only if the same material is selected for the first conductive rubber electrode 11 and the second conductive rubber electrode 12, and the area of the measurement surface of the first conductive rubber electrode 11 and the area of the measurement surface of the second conductive rubber electrode 12 are equalized to each other, then accurate measurement is enabled.

As shown in FIG. 1 and FIG. 2, the first conductive rubber electrode 11 and the second conductive rubber electrode 12 are arranged so as to be spaced from each other at the predetermined interval L. The interval L is set to be six times or more a thickness of the dielectric layer of the electrostatic chuck 1 as the objective of the measurement. When the thickness does not reach six times the thickness of the dielectric layer, the measured value of the ammeter 14 is affected by a surface current flowing on the substrate holding surface of the electrostatic chuck 1 between the first conductive rubber electrode 11 and the second conductive rubber electrode 12, and it becomes difficult to obtain an accurate measured value. The interval L is set to be six times or more the thickness of the dielectric layer of the electrostatic chuck 1 as the objective of the measurement, whereby an error caused by an influence of the surface current can be ignored, and the accurate measurement of the volume resistivity is enabled. However, when such a distance L becomes too large, the areas on which the current is measured become small, and accordingly, there is an apprehension that, on the contrary, it may become difficult to obtain the accurate measured value. Although depending on a material of the dielectric layer of the electrostatic chuck 1, in the case of a dielectric layer with volume resistivity of $10^8$ to $10^{13}$ Ω·cm, which is used as a material of a general electrostatic chuck, a preferable range of the interval L is six times or more the thickness of the dielectric layer of the electrostatic chuck 1. More preferably, the range of the interval L is approximately ten times. The volume resistivity of each of the first conductive rubber electrode 11 and the second conductive rubber electrode 12 is $1\times10^5$ Ω·cm or less. The volume resistivity of these conductive rubber electrodes is a value smaller by three digits or more than the volume resistivity of the dielectric layer of the electrostatic chuck 1 as the objective of the measurement, whereby a measurement result of the volume resistivity of the dielectric layer of the electrostatic chuck 1 is not adversely affected. As the electrostatic chuck 1 for which the measurement is performed by the volume resistivity measurement apparatus of the present invention, one is assumed, in which the volume resistivity of the dielectric layer is approximately $10^8$ Ω·cm or more. Accordingly, in each of the first conductive rubber electrode 11 and the second conductive rubber electrode 12, the volume resistivity thereof is set at $1\times10^5$ Ω·cm or less. Note that, as the conductive rubbers with the volume resistivity of $1\times10^5$ Ω·cm or less, ones on the market are available. Sheets of the conductive rubbers having such volume resistivity are subjected to a forming process such as a punching process so that both thereof can have the equal areas as described above, thus making it possible to obtain the first conductive rubber electrode 11 and the second conductive rubber electrode 12.

Each of the first, conductive rubber electrode 11 and the second conductive rubber electrode 12 is one in which hardness is within a range of 60 to 80 Hs in JIS-A hardness. The hardness of these conductive rubber electrodes is necessary for ensuring adhesion thereof with the substrate holding surface of the electrostatic chuck 1 as the objective of the measurement. If the hardness of these conductive rubber electrodes is too high, then the adhesion with the substrate holding surface of the electrostatic chuck 1 is decreased, and the accurate measurement becomes difficult. Meanwhile, if the hardness of these conductive rubber electrodes is too low, then, when the electrostatic chuck 1 is mounted on the measurement surfaces of the first conductive rubber electrode 11 and the second conductive rubber electrode 12, the first conductive rubber electrode 11 and the second conductive rubber electrode 12 are deformed by the self weight of the electrostatic chuck 1, and it becomes difficult to control the interval L between the first conductive rubber electrode 11 and the second conductive rubber electrode 12 within the above-described range. Hence, as a preferable range free from these malfunctions, the range of the hardness of the first conductive rubber electrode 11 and the second conductive rubber electrode 12 is set at 60 to 80 Hs in JIS-A hardness.

Next, a description will be made of an example of the volume resistivity measurement method for the dielectric layer of the electrostatic chuck according to the present invention. In the event of measuring the volume resistivity of the dielectric layer of the electrostatic chuck, the volume resistivity measurement apparatus according to the above-described embodiment of the present invention is used. By using the volume resistivity measurement apparatus, the electrostatic chuck 1 is mounted on the respective measurement surfaces of the first conductive rubber electrode 11 and the second conductive rubber electrode 12 while opposing the substrate holding surface of the electrostatic chuck 1 to the respective measurement surfaces, and the substrate holding surface of the electrostatic chuck 1 is brought into intimate contact with the measurement surface of the first conductive rubber electrode 11 and the measurement surface of the second conductive rubber electrode 12 by the self weight of the electrostatic chuck 1. Note that means for bringing the electrostatic chuck 1 into intimate contact with the first conductive rubber electrode 11 and the second conductive rubber electrode 12 is not limited to the self weight of the electrostatic chuck 1, and for example, the electrostatic 1 can be brought into intimate contact with the first conductive rubber electrode 11 and the second conductive rubber electrode 12 by pressing the electrostatic chuck 1 thereto.

A predetermined voltage is applied to the first conductive rubber electrode 11 from the direct-current power supply 13 connected thereto, and a current value is measured by the ammeter connected to the second conductive rubber electrode 12. In the case of measuring the current value, in order to accurately measure the volume resistivity of the dielectric layer of the electrostatic chuck 1, it is preferable to calculate the volume resistivity of the dielectric layer by using an average value of current values measured by the ammeter 14, which are obtained after applying a positive voltage and a negative voltage alternately for one minute from the direct-current power supply 13.

As a result of actual measurement of the volume resistivity of the dielectric layer of the electrostatic chuck 1, which is calculated as described above, the volume resistivity of the dielectric layer was within the range of $10^8$ to $10^{13}$ Ω·cm, and had a linear correlation with volume resistivity of the dielectric layer, which was measured by the conventional measurement apparatus and measurement method. From the above, it has been confirmed by the measurement of the inventors of the present invention that the volume resistivity measurement apparatus and measurement method for the dielectric layer of the electrostatic chuck according to the present, invention are practical.

Figure 3:
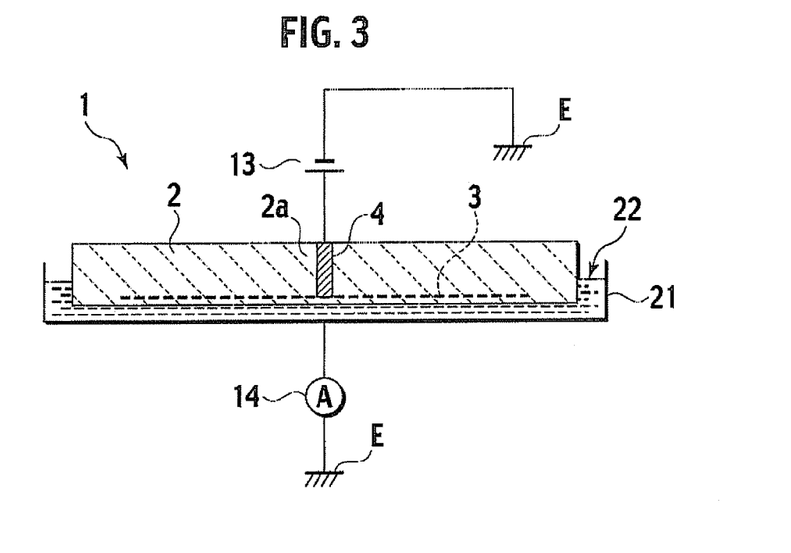
FIG. 3 is a schematic view showing a conventional volume resistivity measurement apparatus for a dielectric layer of an electrostatic chuck.

For comparison with the volume resistivity measurement apparatus for the dielectric layer of the electrostatic chuck according to the present invention, the conventional volume resistivity measurement apparatus for the dielectric layer of the electrostatic chuck is schematically shown in FIG. 3. In the event of measuring the volume resistivity of the dielectric layer of the electrostatic chuck 1 by using the measurement apparatus shown in FIG. 3, a hole 2a that reaches the electrostatic electrode 3 embedded in the base 2 is drilled from a surface of the electrostatic chuck 1, which is opposite with the substrate holding surface, and a measurement terminal 4 loaded into the hole 2a is electrically connected to the electrostatic electrode 3.

The electrostatic chuck 1 as the objective of the measurement is immersed in water 22 housed in a container 21 while allowing the substrate mounting surface to face downward. The positive electrode side of the direct-current power supply 13 is connected to the measurement terminal 4 attached onto the electrostatic chuck (while the negative electrode side is being grounded), the ammeter 14 that is ground is connected to the container 21, and a direct-current voltage is applied to the electrostatic chuck 1 from the direct-current power supply 13. Then, a current flows from the direct-current power supply 13 through the measurement terminal 4, the electrostatic electrode 3, the dielectric layer, the water 22 and the container 21, and a current value is measured by the ammeter 14. The volume resistivity of the dielectric layer of the electrostatic chuck 1 is calculated from a value of the applied voltage and from the measured current value.

In the conventional measurement apparatus shown in FIG. 3, it is necessary to perform a drilling process of the hole 2a for the base 2, and accordingly, time and labor are required for the measurement. Meanwhile, the measurement apparatus according to the present invention, which is shown in FIG. 1, can measure the volume resistivity of the dielectric layer without the above-described drilling process. Therefore, it is obvious that the measurement apparatus according to the present invention is advantageous.

In accordance with the measurement apparatus according to the present invention, a variety of advantages are conceivable since the volume resistivity of the dielectric layer can be measured without the drilling process. For example, when the volume resistivity of the dielectric layer is measured after a rough processing of the electrostatic chuck and before a finishing processing thereof, and there is an electrostatic chuck that goes out of the target volume resistivity from a result of the above-described measurement, it becomes possible to make adjustment to the predetermined target volume resistivity by performing a heat treatment for the electrostatic chuck. In the case of using the conventional measurement apparatus, such adjustment is impossible since the electrostatic electrode 3 exposed to the portion subjected to the drilling process is oxidized by the heat treatment. Moreover, the measurement apparatus according to the present invention enables non destructive and processless measurement for a dielectric layer of a susceptor or the like, which includes a high-frequency electrode therein, without being limited to that of the electrostatic chuck.

EXAMPLE

The volume resistivity of a dielectric layer of an electrostatic chuck was measured by using the apparatus shown in FIG. 1. The electrostatic chuck for which the volume resistivity was measured is one made of aluminum nitride made ceramics with a disc shape in which a diameter of a substrate holding surface is 298 mm.

First, two types of the electrostatic chucks were prepared, in which the volume resistivities of the dielectric layers differed from each other. In the dielectric layers of these electrostatic chucks, the volume resistivities thereof are individually $1 \times 10^{11}$ Ω·cm and $7 \times 10^{11}$ Ω·cm, and a thickness of each thereof is 1 mm. In the event of measuring the volume resistivities of the dielectric layers by using these electrostatic chucks, the volume resistivities were measured under a variety of conditions where the interval between the first conductive rubber electrode 11 and the second conductive rubber electrode 12 was variously changed. The first conductive rubber electrode 11 and the second conductive rubber electrode 12 were ones, in each of which the volume resistivity was $1\times10^4$ Ω·cm, and the hardness was 70 in JIS-A hardness. The first conductive rubber electrode 11 and the second conductive rubber electrode 12 are ones, in which the planar shapes are D-shaped as shown in FIG. 2, and the areas of the respective measurement surfaces are equal to each other. With regard to the voltage application from the direct-current power supply 13 in the event of the measurement, a positive voltage of 500V and a negative voltage of −500V were alternately applied for one minute, and average values of the current values at the respective intervals were obtained.

Figure 4:
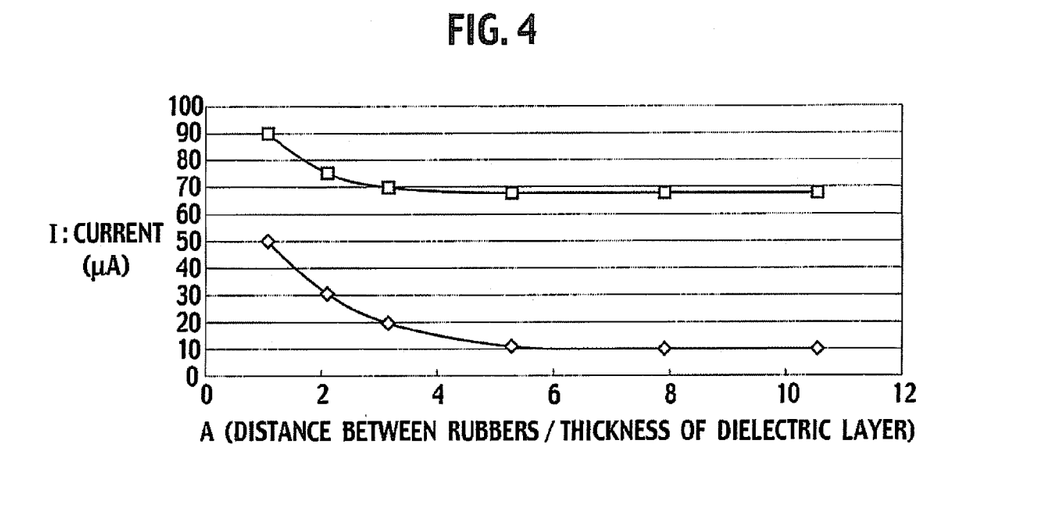
FIG. 4 is a graph showing influences given to measured currents by a ratio of a distance between the conductive rubber electrodes and a thickness of the dielectric layer.

Results obtained for the above-described current values I with respect to a ratio A of the distance between the conductive rubber electrodes and the thickness of the dielectric layer are shown in FIG. 4. As shown in FIG. 4, when the ratio A of the distance between the conductive rubber electrodes and the thickness of the dielectric layer is 6 or more, the current values become constant values in both of the two types of the electrostatic chucks, and accurate current values free from the influence of the surface current between the conductive rubber electrodes were obtained.

Figure 5:
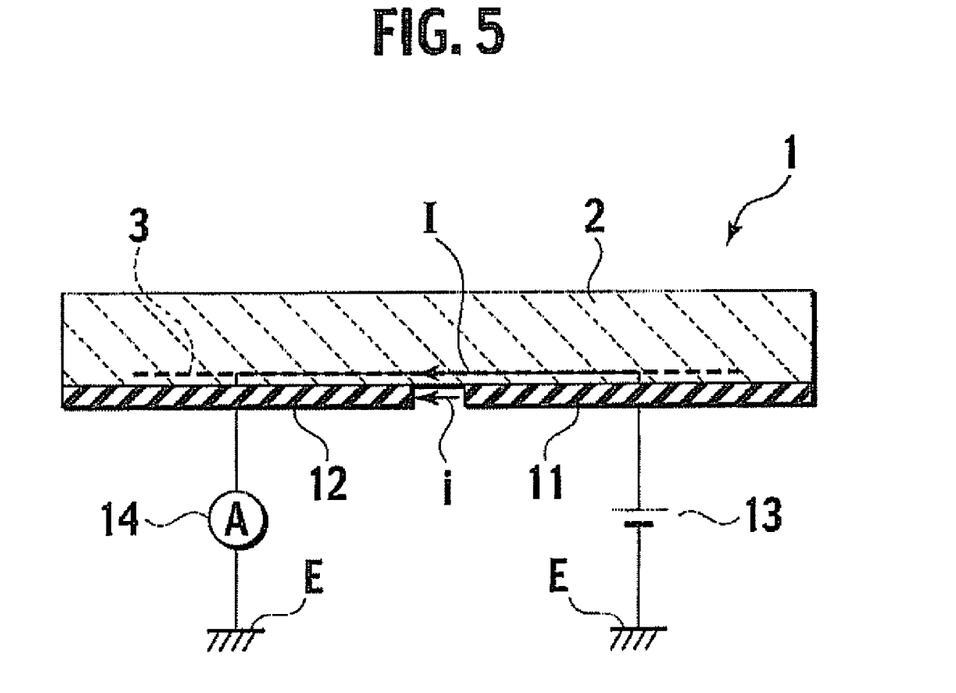
FIG. 5 is a view explaining an influence given to measurement of volume resistivity by a surface current between the conductive rubber electrodes.

By using FIG. 5, a description will be made of the influence given to the measurement of the volume resistivity by the surface current between the conductive rubber electrodes. FIG. 5 is a schematic view of a measurement apparatus according to this embodiment of the present invention, and this measurement apparatus has the same configuration as that of the measurement apparatus shown in FIG. 1. In the event of the measurement of the volume resistivity by using the measurement apparatus shown in FIG. 5, with regard to routes through which the currents flow, there are two types of currents:

I: current passing through the inside (dielectric layer and electrostatic electrode) of the electrostatic chuck and flowing between the conductive rubber electrodes; and i: current passing on the surface of the electrostatic chuck and flowing between the conductive rubber electrodes. The current to be measured by the ammeter 14 becomes the total amount (I+i) of I and i, and the volume resistivity calculated by using the total amount includes an error corresponding to the surface current.

If it is assumed that the applied voltage (V) and the areas of the measurement surfaces of the conductive rubber electrodes are not changed (are constant) at the time of the measurement, R is volume resistance of the dielectric layer, and r is surface resistance of the substrate holding surface between the conductive rubber electrodes, then, as shown in the following Expressions (1) and (2), the above-described resistances R and r are in proportional relationships with the thickness d of the dielectric layer and the distance L between the conductive rubber electrodes, respectively.

$$R \propto d \quad (1)$$

$$r \propto L \quad (2)$$

In order to make it possible to ignore the influence of the surface resistance r from the current value measured by the ammeter 14, it is ideal that a value of a ratio of r with respect to R be infinite (r/R→∞). In actual, if the ratio of r with respect to R is 1000 or more (r/R≧1000), then it can be said that the surface resistance does not affect the measurement. If a relationship of the following Expression (3) is satisfied based on this relationship and the proportional relationships of the above-described Expressions (1) and (2), then an error factor in the event of the measurement can be ignored.

$$L/d \geq A \quad (3) \text{ (A: constant)}$$

From results of the actual measurements, it was verified that the error caused by the surface resistance can be ignored if the value A that is equal to or smaller than L/d in Expression (3) is 6 or more as shown in FIG. 4. This value A becomes a larger value as the resistance of the material of the dielectric layer of the electrostatic chuck is being higher, and becomes a smaller value as the resistance is being lower. However, the value A that is equal to or smaller than L/d is 6 or more within the range of the volume resistivity inherent in the material of the dielectric layer of the electrostatic chuck for which the volume resistivity is measured by using the apparatus of the present invention. From this fact, the error factor in the event of the measurement was ignorable.

Next, the volume resistivities of the dielectric layers of the electrostatic chucks were measured under conditions where the hardness of the conductive rubber electrodes was variously changed. For the electrostatic chucks, two types described above were used, in which the volume resistivities differed from each other. The shape of the conductive rubber electrodes is the same as that, described above. The distance L between the conductive rubber electrodes was set at 6 mm. Results of the measurement are shown in FIG. 6.

Figure 6:
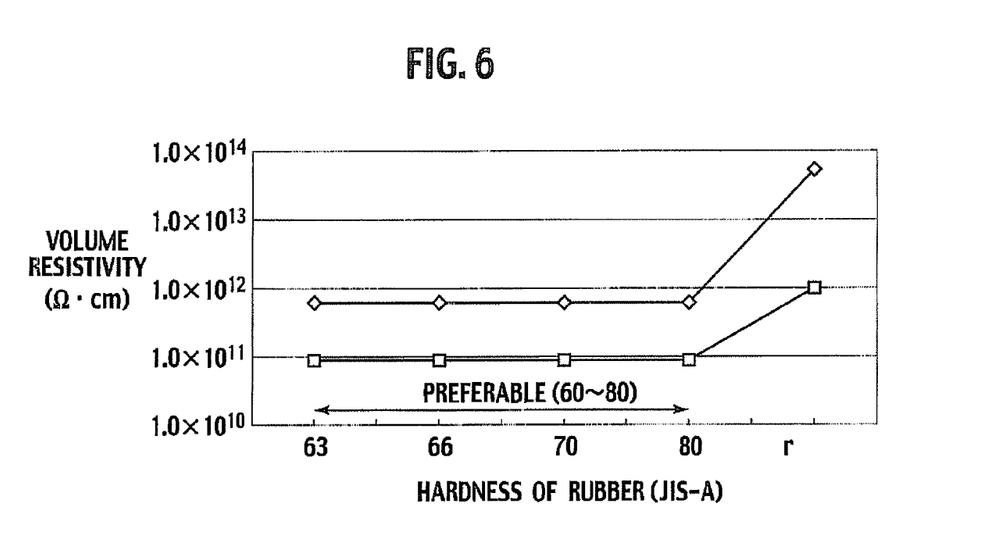
FIG. 6 is a graph showing relationships between hardness of the conductive rubber electrodes and the volume resistivity of the dielectric layer.

As understood from FIG. 6, when the hardness of the conductive rubber electrodes was 80 or less, no variations occurred in the measured volume resistivities, and accurate values were able to be measured. Note that, though not illustrated in FIG. 6, it has already been confirmed that the accurate measurement cannot be performed when the hardness of the conductive rubber electrodes is less than 60.

Next, the volume resistivities of the dielectric layers of the electrostatic chucks were measured under conditions where the volume resistivity of each of the conductive rubber electrodes was variously changed. For the electrostatic chucks, two types described above were used, in which the volume resistivities differed from each other. The shape of the conductive rubber electrodes is the same as that described above. The hardness of the conductive rubber electrodes was set at 70. The distance L between the conductive rubber electrodes was set at 6 mm. Results of the measurement are shown in FIG. 7.

Figure 7:
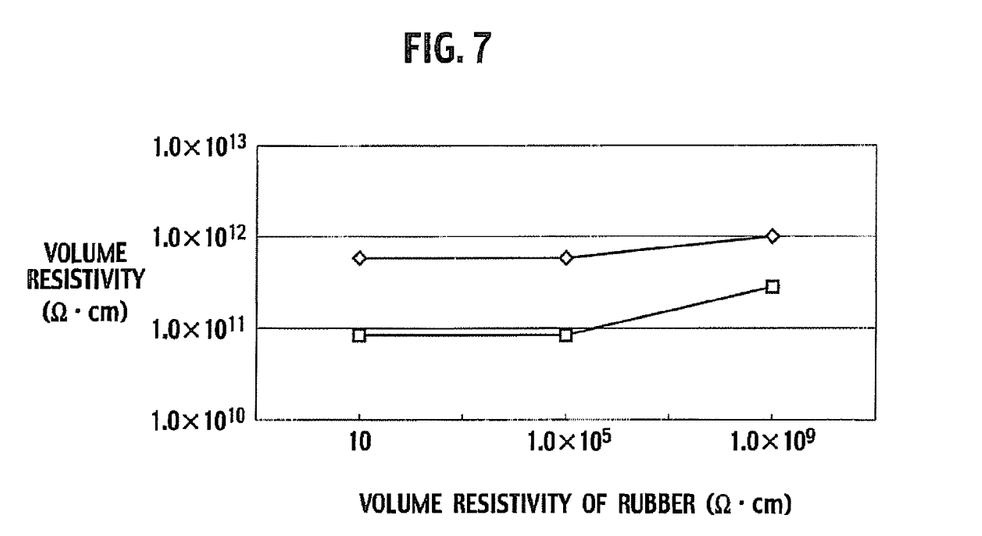
FIG. 7 is a graph showing relationships between volume resistivity of the conductive rubber electrodes and the volume resistivity of the dielectric layer.

As understood from FIG. 7, when the volume resistivities of the conductive rubber electrodes were $1\times10^5$ Ω·cm or less, no variations occurred in the measured volume resistivities, and accurate values were able to be measured.

The description has been made above of the volume resistivity measurement apparatus for the dielectric layer of the electrostatic chuck according to the present invention and the measurement method using the apparatus by using the example and the drawings. However, the measurement apparatus and measurement method of the present invention are not limited to these example and drawings, and various modifications are possible within the scope without departing from the spirit of the present invention.

What is claimed is:

1. A volume resistivity measurement apparatus for a dielectric layer of an electrostatic chuck, comprising:
a pair of conductive rubber electrodes including measurement surfaces opposite to a surface of the dielectric layer of the electrostatic chuck as an objective of measurement, in which the measurement surfaces are arranged at an interval individually on a same plane; and a direct-current power supply and an ammeter, which are provided in an electric circuit that connects the pair of conductive rubber electrodes to each other, wherein the respective conductive rubber electrodes have resistance values equal to each other, and have a shape in which the measurement surfaces have areas equal, to each other.

2. The volume resistivity measurement apparatus for a dielectric layer of an electrostatic chuck according to claim 1, wherein an interval between the respective conductive rubber electrodes is six times or more a thickness of the dielectric layer of the electrostatic chuck as the objective of the measurement, and volume resistivities of the respective conductive rubber electrodes are $1\times10^5$ $\Omega\cdot cm$ or less, and hardness of the respective conductive rubber electrodes is within a range of 60 to 80 Hs in JIS-A hardness.

3. A volume resistivity measurement method for a dielectric layer of an electrostatic chuck, comprising:

using, as a pair of conductive rubber electrodes arranged opposite to a surface of the dielectric layer of the electrostatic chuck as an objective of measurement, electrodes including measurement surfaces opposite to the surface of the dielectric layer of the electrostatic chuck, and having resistance values equal to each other and a shape in which the measurement surfaces have areas equal to each other, in which volume resistivities are $1\times10^5$ $\Omega\cdot cm$ or less, and hardness is within a range of 60 to 80 Hs in JIS-A hardness;

arranging the pair of conductive rubber electrodes so as to place the measurement surfaces of the respective conductive rubber electrodes on a same plane and to space the respective conductive rubber electrodes from each other at an interval of six times or more a thickness of the dielectric layer of the electrostatic chuck, and thereafter, bringing the measurement surfaces and the surface of the dielectric layer of the electrostatic chuck into intimate contact with each other; and calculating the volume resistivity of the dielectric layer of the electrostatic chuck by using an average value of current values measured by an ammeter connected to an electric circuit that connects the pair of conductive rubber electrodes to each other, the current values being obtained after alternately applying a positive voltage and a negative voltage from a direct current power supply provided in the electric circuit.

* * * * *